United States Patent
Hasegawa et al.

(10) Patent No.: US 6,288,597 B1
(45) Date of Patent: Sep. 11, 2001

(54) TEMPERATURE SENSING CIRCUIT FOR VOLTAGE DRIVE TYPE SEMICONDUCTOR DEVICE AND TEMPERATURE SENSING METHOD THEREFORE, AND DRIVE-DEVICE AND VOLTAGE DRIVE TYPE SEMICONDUCTOR DEVICE USING THE SAME

(75) Inventors: Hiroyuki Hasegawa; Toshiki Kurosu; Shigeru Sugayama, all of Hitachi (JP)

(73) Assignees: Hitachi, Ltd., Tokyo (JP); Hitachi Haramachi Electronics Co., Ltd., Hitachi (JP)

( * ) Notice: Subject to any disclaimer, the term of this patent is extended or adjusted under 35 U.S.C. 154(b) by 0 days.

(21) Appl. No.: 09/416,650

(22) Filed: Oct. 12, 1999

(30) Foreign Application Priority Data

Oct. 12, 1998 (JP) ................................... 10-289060

(51) Int. Cl.[7] .......................... H01L 35/00; H01L 37/00; H03K 3/42; H03K 17/78
(52) U.S. Cl. ....................... 327/513; 327/432; 327/403; 327/405; 327/478
(58) Field of Search .................... 327/432, 512, 327/513, 478, 403–405, 433, 434

(56) References Cited

U.S. PATENT DOCUMENTS

| | | | |
|---|---|---|---|
| 3,898,486 | * 8/1975 | Wessel et al. | 327/513 |
| 4,220,877 | * 9/1980 | Giordano | 327/513 |
| 4,914,542 | * 4/1990 | Wagoner | 361/98 |
| 5,045,964 | * 9/1991 | Bennett et al. | 361/254 |
| 5,444,219 | * 8/1995 | Kelly | 219/505 |
| 5,631,494 | * 5/1997 | Sakural et al. | 257/572 |
| 5,635,823 | * 6/1997 | Murakami et al. | 323/277 |
| 5,723,916 | * 3/1998 | Disney et al. | 327/314 |
| 5,796,290 | 8/1998 | Takahashi | 327/512 |
| 5,886,515 | * 3/1999 | Kelly | 327/513 |

FOREIGN PATENT DOCUMENTS

| | | |
|---|---|---|
| 6-244413 | 9/1994 | (JP) . |
| 7-067383 | 3/1995 | (JP) . |

* cited by examiner

*Primary Examiner*—Terry D. Cunningham
*Assistant Examiner*—Long Nguyen
(74) *Attorney, Agent, or Firm*—Antonelli, Terry, Stout & Kraus, LLP

(57) ABSTRACT

In order to provide a highly accurate and reliable temperature sensing circuit and method, a resistor (10a) having a positive temperature coefficient is connected between the gate terminal (4) and the insulated gate electrode (8a) of the voltage drive type semiconductor device (1a), and the temperature is sensed based on a voltage representing a voltage drop across the resistor in a circuit portion between the gate terminal (4) and the other terminal (5).

17 Claims, 5 Drawing Sheets

TEMPERATURE SENSING CIRCUIT FOR VOLTAGE DRIVE TYPE SEMICONDUCTOR DEVICE AND TEMPERATURE SENSING METHOD THEREFORE, AND DRIVE-DEVICE AND VOLTAGE DRIVE TYPE SEMICONDUCTOR DEVICE USING THE SAME

BACKGROUND OF THE INVENTION

The present invention relates to a temperature sensing circuit and a temperature sensing method for a voltage drive type semiconductor device.

As one of the protective functions typically provided for a conventional IGBT (Insulated Gate Bipolar Transistor) module containing IGBTs, representing a kind of voltage drive type semiconductor device, temperature sensing using a temperature sensing circuit is employed for detecting a temperature rise of the IGBT module in order to switch off the IGBT before it becomes damaged. For example, such a conventional IGBT module is disclosed in Japanese Patent Application laid-open No. 7-67389.

The temperature rise of an IGBT module is detected by a temperature sensing circuit using a thermistor, and the signal produced by the temperature sensing circuit is transmitted to a control circuit to control the operation of the IGBT. The thermistor is attached on a cooling fin on which the IGBT module is mounted; and so, when the temperature of the cooling fin rises, the resistance of the thermistor is decreased and the terminal voltage thereof is also decreased. When the temperature exceeds a preset temperature, the temperature sensing circuit operates to switch off the IGBT by making use of this characteristic.

FIG. 6 shows a temperature sensing circuit 31 using a thermistor 29 attached to a cooling fin, a control circuit 26 for controlling an IGBT module 9a, and a gate drive circuit 12.

In the temperature sensing circuit 31, one end of the thermistor 29 is connected in series with a resistor 30 and a voltage source, and the junction between the thermistor 29 and the resistor 30 is connected to an input terminal of a voltage comparing circuit 13. The other end of the thermistor 29 is connected to ground potential. A second input terminal of the voltage comparing circuit 13 is connected to a constant voltage circuit 18, and the output terminal thereof is connected to the control circuit 26.

In FIG. 6, since the thermistor for temperature sensing is a part mounted on the cooling fin, a temperature change of the IGBT is sensed by the temperature of the cooling fin. Therefore, when an IGBT element 1a generates heat due to an over-current or the like, there arises a problem in that the temperature transmitted to the thermistor differs depending on the position of the element which is generating heat. In this regard, the temperature sensing accuracy is decreased as the distance between the element and the thermistor increases.

SUMMARY OF THE INVENTION

An object of the present invention is to provide a highly reliable temperature sensing circuit and a highly reliable temperature sensing method by taking the above-mentioned problem into consideration.

A temperature sensing circuit and a temperature sensing method in accordance with the present invention are applied to a voltage drive type semiconductor device comprising a semiconductor element for controlling current flowing between a pair of main electrodes in response to a voltage applied to an insulated gate electrode of the semiconductor device; a gate terminal electrically connected to the insulated gate electrode; another terminal electrically connected to one main electrode among the pair of main electrodes. As the semiconductor element, there are various kinds of semiconductor elements having an insulated gate electrode, such as an MOSFET and so on, in addition to an IGBT. As the voltage drive type semiconductor device, there are, for example, a power semiconductor module, a resin seal type semiconductor device and so on.

In the temperature sensing circuit in accordance with the present invention, a resistor having a positive temperature coefficient is connected between the gate terminal and the insulated gate electrode of a voltage drive type semiconductor device. Further, the temperature sensing circuit comprises a means for receiving a voltage, representing a voltage drop across the resistor disposed in a circuit portion between the gate terminal and said other terminal, and for sensing the temperature of the voltage drive type semiconductor device based on the received voltage.

The temperature sensing circuit in accordance with the present invention, as described above, makes use of the fact that, when a resistor having a positive temperature coefficient is connected between the gate terminal and the insulated gate electrode of a semiconductor device, a voltage representing a voltage drop across the resistor disposed in a circuit portion between the gate terminal and said other terminal is changed by the temperature of the voltage drive type semiconductor device. Therefore, the sensing response to a temperature change in the voltage drive type semiconductor device becomes fast. Accordingly, by sensing the temperature based on the received voltage, a temperature sensing circuit having a high reliability can be obtained.

In the temperature sensing method in accordance with the present invention, a resistor having a positive temperature coefficient is connected between the gate terminal and the insulated gate electrode of the semiconductor element; and a temperature is sensed based on a voltage representing a voltage drop across the resistor disposed in a circuit portion between the gate terminal and said other terminal during a mirror effect condition which is generated when the semiconductor element turns off.

The temperature sensing method in accordance with the present invention, as described above, makes use of the fact that, when a resistor having a positive temperature coefficient is connected between the gate terminal and the insulated gate electrode of the semiconductor device, a voltage including a voltage drop across the resistor disposed in a circuit portion between the gate terminal and said other terminal during a mirror effect condition which is generated when the semiconductor element turns off. Accordingly, similar to the temperature sensing circuit in accordance with the present invention, as described above, the sensing response becomes fast and a temperature sensing circuit having a high reliability can be obtained.

It is preferable when the resistor connected between the gate terminal and the insulated gate electrode in the voltage drive type semiconductor device is contained in the voltage drive type semiconductor device. By doing so, since the resistor is placed in a position near the semiconductor element, which represents the heat generating source, the temperature sensing accuracy can be improved. Further, as the resistor, it is possible to use a resistor which is contained in the voltage drive type semiconductor device primarily for a purpose other than temperature sensing, such as a gate resistor.

A drive device for a voltage drive type semiconductor device in accordance with the present invention comprises a drive circuit connected to the gate terminal through another resistor and to said other terminal; and the temperature sensing circuit in accordance with the present invention as described above.

The drive device for a temperature sensing circuit in accordance with the present invention, as described above, makes use of the fact that, when a resistor having a positive temperature coefficient is connected between the gate terminal and the insulated gate electrode and another resistor is connected between the drive circuit and the gate terminal, a voltage corresponding to a voltage drop across the resistor disposed in a circuit portion between the gate terminal and said other terminal is changed by the temperature of the voltage drive type semiconductor device. Therefore, by controlling the drive device based on the output signal of the temperature sensing circuit, a highly accurate protective operation relative to the temperature can be performed.

In a case where the voltage drive type semiconductor device comprises a plurality of semiconductor elements, the voltage drive type semiconductor device having the following structure is suitable for use of the temperature sensing circuit and the temperature sensing method described above to effect temperature protection thereof. The voltage drive type semiconductor device comprises a semiconductor element controlling current flowing between a pair of main electrodes in accordance with a voltage applied to an insulated gate electrode of the semiconductor device; a gate terminal electrically connected to the insulated gate electrode; another terminal electrically connected to one main electrode among the pair of main electrodes; a resistor circuit including a resistor having a positive temperature coefficient connected between the gate terminal and the insulated gate electrode; another semiconductor element having an insulated gate electrode and being connected to the semiconductor element in parallel, wherein the resistor circuit comprises a first resistor and a second resistor connected to each other in series, and a third resistor connected between a junction point of the first resistor and the second resistor and the insulated gate electrode of the other semiconductor element.

DETAILED DESCRIPTION OF THE PREFERRED EMBODIMENT (First embodiment)

Figure 1A:
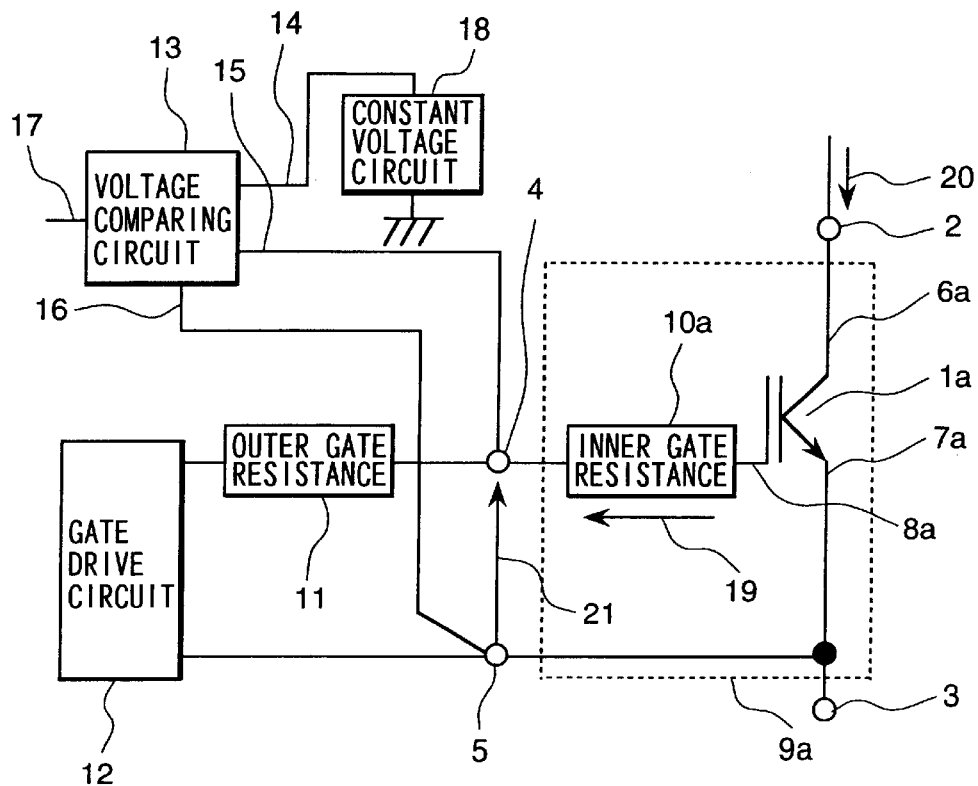
FIGS. 1A and 1B are a schematic circuit diagram and a plan view, respectively, of a first embodiment of the present invention.

FIG. 1A shows a first embodiment of the present invention. An inner gate resistor (rg) 10a is connected between a gate electrode 8a of an IGBT chip 1a and a gate terminal 4 of an IGBT module 9a, and an outer gate resistor (RG) 11 is connected between the gate terminal 4 of the IGBT module 9a and a gate drive circuit 12. The gate terminal 4 of the IGBT module 9a is connected to an input terminal (B) 15 of a voltage comparing circuit 13, and an auxiliary emitter terminal 5 of the IGBT module 9a is connected to a ground terminal 16 of the voltage comprising circuit 13 and to the gate drive circuit 12. A constant voltage circuit 18 is connected to an input terminal (A) 14 of the voltage/comparing circuit 13.

Figure 1B:
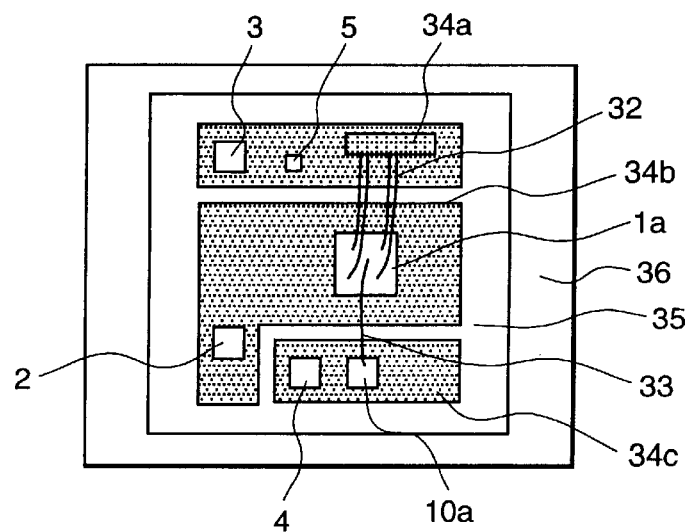

FIG. 1B is a view showing the inner structure of the IGBT module 9a. An insulator plate 35 is disposed on a heat radiating plate 36, and metal plates 34a, 34b, 34c are placed on the insulator plate 35. A collector electrode portion of the IGBT chip 1a is connected to the metal plate 34b, one end of the inner gate resistor 10a is connected to the metal plate 34c, and the other end of the inner gate resistor 10a is connected to a gate electrode portion of the IGBT chip 1a with a lead wire 33. An electrode 3 for leading the emitter terminal to the outside of the module, an electrode 2 for leading the collector terminal to the outside of the module and an electrode 4 for leading the gate terminal to the outside of the module are connected to each of the metal plates 34a, 34b, 34c, respectively.

Referring again to FIG. 1A, when a collector current 20 passing through the IGBT chip 1a becomes excessively large and the temperature of the IGBT chip 1a rises due to an increase of the generated energy loss in the IGBT chip 1a, the temperature of the inner gate resistor (rg) 10a mounted on the same heat radiating plate is also increased. At that time, the value of the voltage drop across the inner gate resistor (rg) 10a is changed due to existence of a temperature coefficient of resistivity, which is a physical property possessed by the inner gate resistor (rg) 10a. The change in the voltage drop across the inner gate resistor (rg) 10a is detected as a voltage (VGE) 21 between the gate and the emitter, and this voltage (VGE) 21 is input to the input terminal (B) 15 of the voltage comparing circuit 13. A constant voltage value from the constant voltage circuit 18 is input to the other input terminal (A) 14 of the voltage comparing circuit 13, and a voltage compared result of the voltage comparing circuit 13 is output from an output terminal 17 of the voltage comparing circuit 13.

Figure 5A:
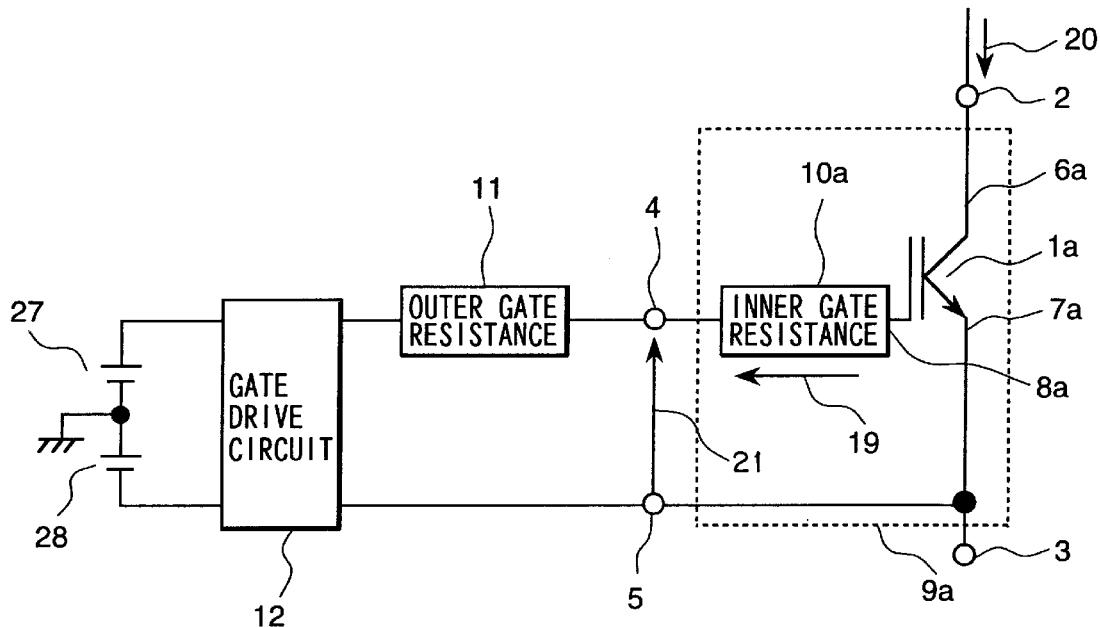
FIGS. 5A and 5B are a schematic circuit diagram and a waveform diagram, respectively, for explaining the operation of each embodiment of the present invention.
Figure 5B:
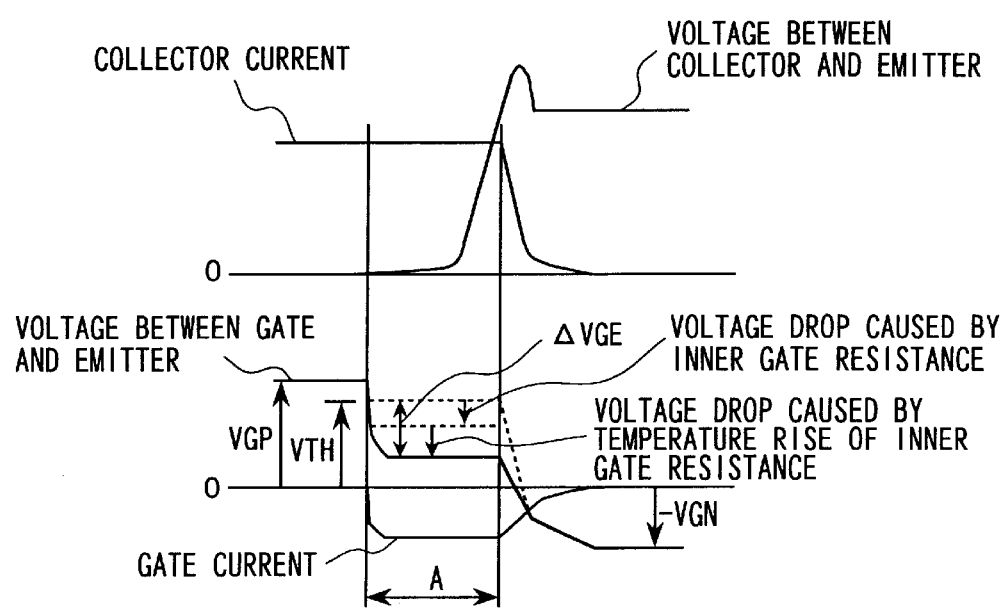

FIG. 5A and FIG. 5B will be used to explain the operation of the present embodiment. The timing for detecting the change in the voltage drop 19 generated across the inner gate resistor 10a of the module corresponds to the time, referring to FIG. 5B, when the voltage (VGE) 21 between the gate and the emitter of the IGBT module 9a is in a mirror effect occurring period A caused by the action of a feedback capacity existing between the collector electrode and the gate electrode of the IGBT chip 1a at the time of turning-off of the IGBT chip 1a. The gate voltage appearing between the gate and the emitter of the IGBT chip 1a in the mirror effect occurring period A described above is a constant value, and the gate current value is a constant value.

The voltage generated between the gate terminal 4 and the auxiliary emitter terminal 5 in the IGBT module 9a shown in FIG. 5A is the sum of the constant value of the gate voltage in the mirror effect occurring period A described above and the voltage value across the inner gate resistor 10a of the module.

The operation accompanied by a change in the temperature of the IGBT chip in this embodiment will be described below. The temperature coefficients of the resistivity possessed by the resistors, such as the gate resistor mounted inside the module, are positive values.

Referring to FIG. 1A, when the temperature of the IGBT module 9a is increased, the resistance of the inner gate resistor (rg) 10a is increased with the increase in temperature, and, accordingly, the voltage produced across the inner gate resistor (rg) 10a is increased. Therefore, the constant voltage value generated between the gate terminal 4 and the auxiliary emitter terminal 5 in the period A of FIG. 5B is decreased, and the signal at the output terminal 17 of the temperature sensing circuit is inverted in polarity when the voltage value is decreased below the constant voltage value applied to the input terminal (A) 14 of the voltage comparing circuit 13. In response to the signal at the output terminal 17, a control circuit is operated, and, for example, the IGBT is turned off.

Referring to FIG. 5B, the amount of change (ΔVGE) in the gate voltage produced between the gate terminal 4 and the auxiliary emitter terminal 5 due to the temperature change of the inner gate resistor (rg) 10a in the period A depends on the ratio of the resistance value rg of the inner gate resistor (rg) 10a to the resistance value RG of the outer gate resistor (RG) 11. Letting the temperature coefficient of the inner gate resistor (rg) be α, the voltage output from the gate drive circuit 12 in the period A be VGN, and the gate threshold voltage possessed by the IGBT chip 1a depending on the collector current 20 flowing in the IGBT module 9a be VTH, the amount of change ΔVGE in the gate voltage can be expressed by Equation 1.

$$\Delta VGE = (\alpha \times rg/(\alpha \times rg + RG)) \times (VGN + VTH) \quad \text{(Equation 1)}$$

According to this equation 1, the temperature change of the inner gate resistor of the module in the period A shown in FIG. 5B can be considered as corresponding to the amount of change ΔVGE in the gate voltage produced between the gate terminal 4 and the auxiliary emitter terminal 5. Therefore, the temperature of the IGBT module 9a can be detected by using a calculator for calculating temperature based on the equation 1 in response to the gate voltage, instead of using the voltage comparing circuit.

Figure 7:
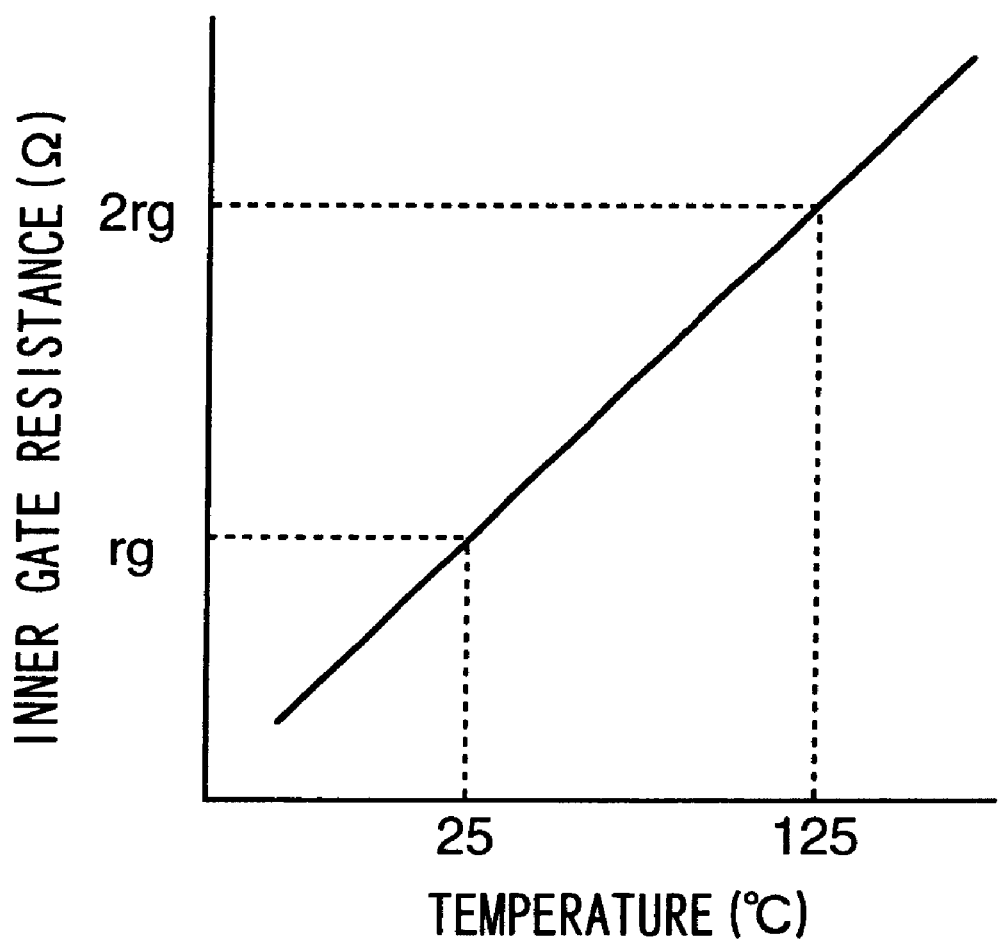
FIG. 7 is a graph which shows a relationship between temperature and inner gate resistance in the first embodiment.

Temperature sensing in the present embodiment will be described in more detail. Referring to FIG. 1A, when the collector current 20 passing through the IGBT chip 1a becomes excessively large and the temperature of the IGBT chip 1a is increased from 25° C. to 125° C. corresponding to an increase in the generated energy loss of the IGBT chip 1a, the resistance of the inner gate resistor (rg) 10a is increased to approximately twice its previous value, as shown in FIG. 7, and the gate voltage produced between the gate terminal 4 and the auxiliary emitter terminal 5 changes. An example based on FIG. 5B will be considered, using the equation 1 for calculating the amount of change ΔVGE in the gate voltage. Assuming that VGP=15 V, VGN=10V, VTH=8V, RG=10Ω, rg=2Ω (at 25° C.) and rg=4Ω (at 125° C.), the calculation results in ΔVGE=3 V at 25° C. and ΔVGE=5.1 V at 125° C., and the difference 2.1 V is the amount of change in the gate voltage caused by the temperature rise. That is, in FIG. 5B, the constant voltage values of the gate voltage in the period A are 5 V at 25° C. and 2.9 V at 125° C. These voltage values are compared with the constant voltage value applied to the input terminal (A) 14 of the voltage comparing circuit 13 of FIG. 1A, and the output of the temperature sensing device inverts in polarity when the input voltage from gate terminal 14 is decreased below the constant voltage level at input terminal (A) 14. For example, when the voltage of the input terminal (A) 14 of the voltage comparing circuit 13 is assumed to be 3 V, and the voltage of the input terminal (B) 15 of the voltage comparing circuit 13 is changed from 5 V to 2.9 V in response to the temperature rise in the IGBT module 9a from 25° C. to 125° C., the temperature sensing operation is performed because the voltage of the input terminal (B) 15 becomes lower than the applied voltage of the input terminal (A) 14.

(Second embodiment)

Figure 2:
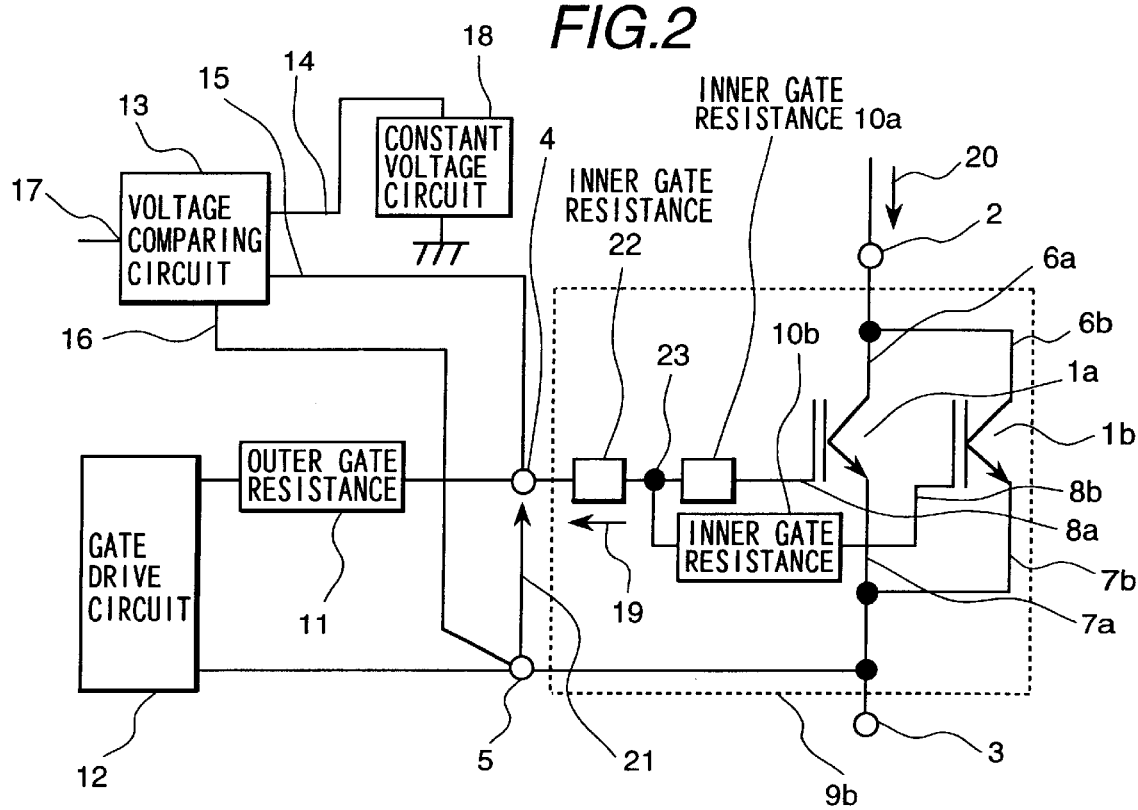
FIG. 2 is a schematic circuit diagram of a second embodiment of the present invention.

FIG. 2 shows a second embodiment of the present invention. This embodiment represents a case where a plurality of IGBTs are connected in parallel. An inner gate resistor (rg) 10a and an inner gate resistor (rt) 22 are connected in series between a gate electrode 8a of an IGBT 1a and a gate terminal 4 of an IGBT module 9b, and an outer gate resistor (RG) 11 is connected between the gate terminal 4 of an IGBT module 9b and a gate drive circuit 12. The gate terminal 4 of the IGBT module 9b is connected to an input terminal (B) 15 of a voltage comparing circuit 13, and an auxiliary terminal 5 of the IGBT module 9b is connected to a ground terminal 16 of the voltage comparing circuit 13 and to the gate drive circuit 12. A constant voltage circuit 18 is connected to an input terminal (A) 14 of the voltage comparing circuit 13. Further, a collector electrode 6b of the IGBT 1b is connected to a collector electrode 6a of the IGBT 1a, an emitter electrode 7b of the IGBT 1b is connected to an emitter electrode 7a of the IGBT 1a, and an inner gate resistor (rg) 10b is connected between the gate electrode 8b of the IGBT 1b and point 23 (that is, a junction point of the inner gate resistor 22 and the inner gate resistor 10a).

Referring to FIG. 2, when the inner gate resistor (rg) 10a of the IGBT 1a and the inner gate resistor (rg) 10b of the IGBT 1b are connected in parallel, the amount of change in the sensing level is decreased because the equivalent resistance becomes small, and, accordingly, the voltage drop is decreased. Therefore, in order to increase the sensing level, the equivalent resistance is increased to increase the voltage drop by connecting the inner gate resistor (rt) 22 in series to the combination of the inner gate resistors (rg) 10a and 10b.

As shown in FIG. 5B, the timing of temperature sensing is performed in the period A when the voltage (VGE) 21 between the gate and the emitter of the IGBT module 9b becomes a clamp voltage at the time of turning-off of the IGBT 1a and the IGBT 1b. In general, a voltage drop is produced across the inner gate resistor by gate current 19 flowing at the time of turning-off of the IGBT 1a and the IGBT 1b to decrease the clamp voltage. Referring to FIG. 2, when the temperature of the IGBT module 9b is increased, the composite resistance of the inner gate resistor is increased with the increase in the temperature, and, accordingly, the voltage produced across the composite inner gate resistor is increased. Therefore, the clamp voltage in the period of FIG. 5B is further decreased, and the temperature sensing circuit is operated when the voltage value is decreased to a value below the constant voltage value applied to the input terminal (A) 14 of the voltage comparing circuit 13.

Referring to FIG. 5B, the amount of change (ΔVGE) in the clamp voltage due to the temperature change of the inner gate resistor in the period A is determined by the ratio of the composite resistance of the inner gate resistors (rg) 10a, 10b and the inner gate resistor (rt) 22 to the resistance of the outer gate resistor (RG) 11. Letting the temperature coefficient/of the composite inner gate resistor be α, the composite inner gate resistance be r, the negative voltage applied to the gate terminal 4 be VGN, and the clamp voltage depending on a collector current 20 flowing in the IGBT module 9b be VTH, the amount of change (ΔVGE) in the clamp voltage due to the temperature change of the inner gate resistor in the period A can be expressed by Equation 2.

$$\Delta VGE = (\alpha Xr/(\alpha Xr + RG)) X(VGN + VTH) \quad \text{(Equation 2)}$$

The temperature change can be detected based on ΔVGE similarly to the first embodiment.

(Third embodiment)

Figure 3:
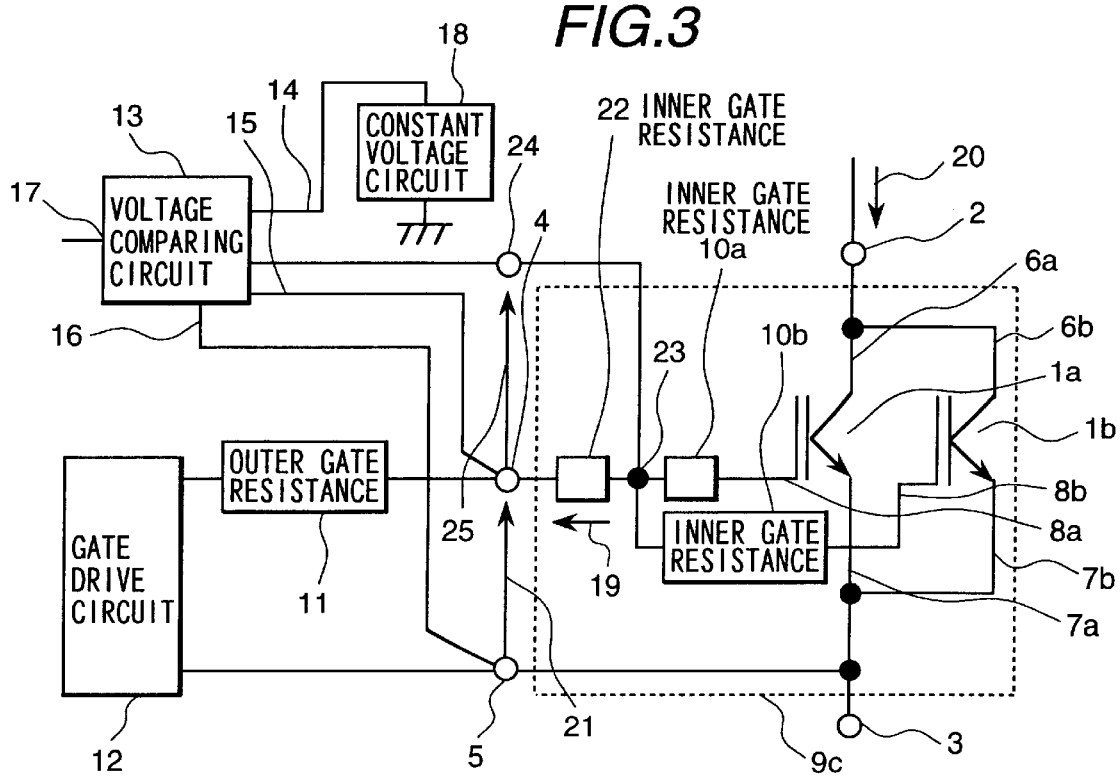
FIG. 3 is a schematic circuit diagram of a third embodiment of the present invention.

FIG. 3 shows a third embodiment of the present invention. This embodiment is another case where a plurality of IGBTs are connected in parallel. An inner gate resistor (rg) 10a and an inner gate resistor (rt) 22 are connected in series between a gate electrode 8a of an IGBT 1a and a gate terminal 4 of an IGBT module 9c, and an outer gate resistor (RG) 11 is connected between the gate terminal 4 of the IGBT module 9c and a gate drive circuit 12. The gate terminal 4 of the IGBT module 9b is connected to an input terminal (B) 15 of a voltage comparing circuit 13, and an auxiliary terminal 5 of the IGBT module 9c is connected to a ground terminal 16 of the voltage comparing circuit 13 and to the gate drive circuit 12. A constant voltage circuit 18 is connected to an input terminal (A) 14 of the voltage comparing circuit 13. Further, a collector electrode 6b of the IGBT 1b is connected to a collector electrode 6a of the IGBT 1a, an emitter electrode 7b of the IGBT 1b is connected to an emitter electrode 7a of the IGBT 1a, and an inner gate resistor (rg) 10b is connected between the gate electrode 8b of the IGBT 1b and point (B) 23 (that is, a junction point of the inner gate resistor 22 and the inner gate resistor 10a). Further, a temperature sensing terminal 24 is provided and connected to the point 23.

Referring to FIG. 3, when the inner gate resistor (rg) 10a of the IGBT 1a and the inner gate resistor (rg) 10b of the IGBT 1b are connected in parallel, the amount of change in the sensing level is decreased because the equivalent resistance becomes small, and, accordingly, the voltage drop is decreased. Therefore, by connecting the inner gate resistor (rt) 22 in series with the inner gate resistors (rg) 10a and 10b, and, further, by connecting the temperature sensing terminal 24 to the point (B) 23 at the one end of the inner gate resistor (rt) 22, the temperature detecting operation is performed by detecting the terminal voltage of the inner gate resistor (rt) 22.

Similarly to FIG. 5B, the timing of temperature sensing is performed by detecting the voltage (VTG) between the temperature sensing terminal 24 and the gate terminal 4 in the period A when the voltage (VGE) 21 between the gate and the emitter of the IGBT module 9c becomes a clamp voltage at the time of turning-off of the IGBT 1a and the IGBT 1b. In general, the voltage (VTG) 25 is generated in the inner gate resistor (rt) 22 by the gate current 19 flowing at the time of turning-off of the IGBT 1a and the IGBT 1b to decrease the clamp voltage. Referring to FIG. 3, when the temperature of the IGBT module 9c is increased, the resistance of the inner gate resistor (rt) 22 is increased depending on the temperature and the voltage produced across the inner gate resistor 22 is further increased. Then, the present temperature sensing circuit is operated when the voltage value is increased with respect to the constant voltage value applied to the input terminal (A) 14 of the voltage comparing circuit 13.

Referring to FIG. 3, letting the temperature coefficient of the inner gate resistor (rt) 22 be α, and the gate current be Ig, the amount of change (ΔVTG) in the voltage produced in the inner gate resistor (rt) 22 by the temperature rise in the period A can be expressed by Equation 3.

$$\Delta VTG = \alpha XrtXIg \quad \text{(Equation 3)}$$

Similarly to the case of ΔVGE, the temperature change can be detected from the change ΔVTG in the gate voltage.

(Fourth embodiment)

Figure 4:
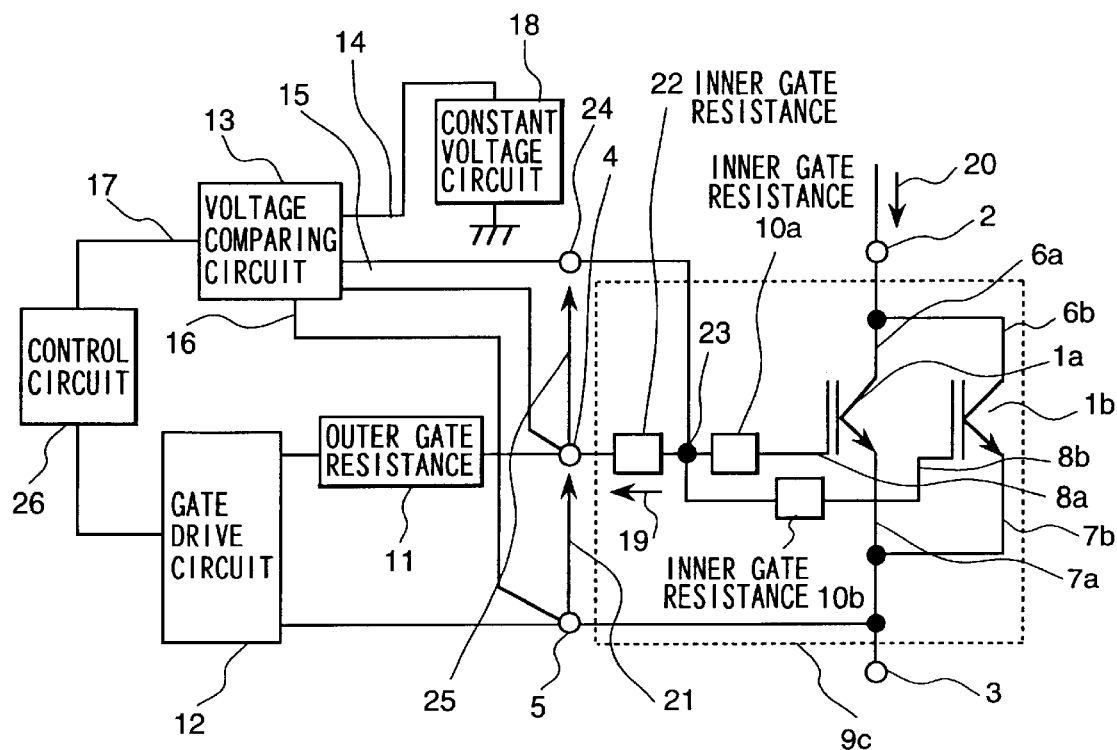
FIG. 4 is a schematic circuit diagram of a fourth embodiment of the present invention.
Figure 6:
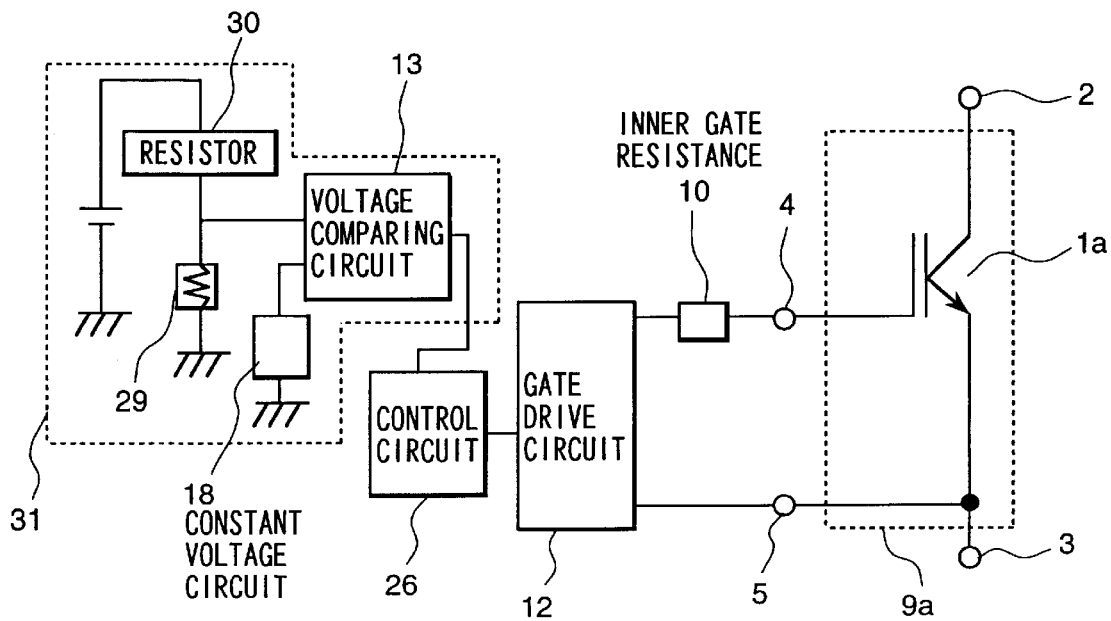
FIG. 6 is a schematic circuit diagram showing an example of the prior art.

FIG. 4 shows a fourth embodiment of the present invention. Using the circuit structure of the third embodiment, the output of the voltage comparing circuit 13 is connected to the control circuit 26, and the output of the control circuit 26 is connected to the gate drive circuit 12.

In the third embodiment, when the terminal voltage of the inner gate resistor 22 is decreased to a value lower than the voltage of the input terminal (A) 14 of the voltage comparing circuit 13, the voltage comparing circuit 13 regards this condition as the occurrence of an abnormality and outputs a signal indicating the abnormality to the control circuit 26. The control circuit 26 outputs an off operation instruction to the gate drive circuit 12 when receiving the signal indicating the abnormality. When the gate drive circuit 12 receives the off operation instruction, the gate drive circuit 12 operates to turn off the drive of the IGBT 1a and the IGBT 1b.

In the above embodiments, examples of the present invention have been considered in which an IGBT is used as the switching element. However, in a case of using a voltage drive type switching element, such as a power MOSET, the circuit operation is the same as described above, and the same effect can be attained.

According to the present invention, by connecting a resistor for temperature sensing to a voltage drive type semiconductor device, it is possible to provide a highly reliable temperature sensing circuit.

What is claimed is:

1. A temperature sensing circuit for a semiconductor module comprising a semiconductor element for controlling current flowing between a pair of main electrodes of the semiconductor element in response to a voltage applied to an insulated gate electrode of the semiconductor element; a gate terminal of the semiconductor module electrically connected to said insulated gate electrode; and an auxiliary terminal of the semiconductor module electrically connected to one of said pair of main electrodes, wherein said temperature sensing circuit further comprises:

a resistor device having a positive temperature coefficient located in said semiconductor module and connected between said gate terminal of said semiconductor module and said insulated gate electrode of said semiconductor element; and means connected to receive a voltage representing a voltage drop across said resistor device in a circuit portion between said gate terminal and said auxiliary terminal for sensing the temperature of said semiconductor module based on said voltage.

2. A temperature sensing circuit according to claim 1, wherein said voltage is a voltage existing between said gate terminal and said auxiliary terminal.

3. A temperature sensing circuit according to claim 1, wherein said voltage which occurs is a voltage which exists during a mirror effect generated when said semiconductor element turns off.

4. A temperature sensing circuit according to claim 1, wherein said semiconductor module further comprises another semiconductor element having an insulated gate electrode and which is connected in parallel to said semiconductor element, and said resistor device comprises a first resistor and a second resistor, connected to each other in series, and a third resistor connected between a junction point of said first resistor and said second resistor and the insulated gate electrode of said other semiconductor element, one end of said first resistor being connected to said insulated gate electrode.

5. A temperature sensing circuit according to claim 4, wherein said voltage which appears is a voltage between said gate terminal and said auxiliary terminal.

6. A temperature sensing circuit according to claim 4, wherein said voltage which occurs is a voltage between said gate terminal and said junction point.

7. A temperature sensing circuit for a semiconductor module comprising a semiconductor element controlling current flowing between a pair of main electrodes of the semiconductor element in response to a voltage applied to an insulated gate electrode of the semiconductor element; a gate terminal of the semiconductor module electrically connected to said insulated gate electrode; and an auxiliary terminal of the semiconductor module electrically connected to one main electrode among said pair of main electrodes of the semiconductor element, which said temperature sensing circuit further comprises:

a resistor having a positive temperature coefficient located in said semiconductor module connected between said gate terminal of the semiconductor module and said insulated gate electrode of the semiconductor element, and means connected to receive a voltage representing a voltage drop across said resistor in a circuit portion between said gate terminal and said auxiliary terminal for sensing the temperature of said semiconductor module based on said voltage.

8. A method for sensing the temperature of a semiconductor module comprising a semiconductor element for controlling current flowing between a pair of main electrodes of the semiconductor element in response to a voltage applied to an insulated gate electrode of the semiconductor element; a gate terminal of the semiconductor module electrically connected to said insulated gate electrode; and an auxiliary terminal of the semiconductor module electrically connected to one main electrode among said pair of main electrodes, the method further comprises the steps of:

connecting a resistor having a positive temperature coefficient between said gate terminal of said semiconductor module and said insulated gate electrode of the semiconductor element, said resistor being located in said semiconductor module; and sensing the temperature of said semiconductor module based on a voltage representing a voltage drop across said resistor in a circuit portion between said gate terminal and said auxiliary terminal during a mirror effect generated when said semiconductor element turns off.

9. A drive device for a semiconductor module comprising a semiconductor element for controlling current flowing between a pair of main electrodes of the semiconductor element in response to a voltage applied to an insulated gate electrode of the semiconductor element; a gate terminal of the semiconductor module electrically connected to said insulated gate electrode; and an auxiliary terminal of the semiconductor module electrically connected to one main electrode among said pair of main electrodes, which said drive device further comprises:

a drive circuit connected to a resistor having a positive temperature coefficient located in the semiconductor module between said gate terminal of said semiconductor module and said insulated gate electrode of said semiconductor element through another resistor and also connected to said auxiliary terminal; and a temperature sensing circuit connected to receive a voltage representing a voltage drop across said resistor in a circuit portion between said gate terminal and said auxiliary terminal for sensing the temperature of said semiconductor module based on said voltage.

10. A drive device according to claim 9, which further comprises a control circuit responsive to a signal output from said sensing means when said temperature rise is detected by said temperature sensing circuit for giving an OFF operation instruction to said drive circuit.

11. A voltage drive type semiconductor device comprising:

a first semiconductor element for controlling current flowing between a pair of main electrodes of the first semiconductor element in response to a voltage applied to an insulated gate electrode of the first semiconductor element; a gate terminal electrically connected to said insulated gate electrode; and an auxiliary terminal electrically connected to one main electrode among said pair of main electrodes; which said voltage drive type semiconductor device further comprises:

a resistor circuit including a resistor having a positive temperature coefficient connected between said gate terminal and said insulated gate electrode; and a second semiconductor element having an insulated gate electrode and connected in parallel to said first semiconductor element, wherein said resistor circuit comprises a first resistor and a second resistor, connected to each other in series, and a third resistor connected between a junction point of said first resistor and said second resistor and the insulated gate electrode of said second semiconductor element, wherein said first semiconductor element, second semiconductor element, said second resistor and said third resistor are all arranged in a common semiconductor module, and wherein the gate terminal and the auxiliary terminal are located outside said semiconductor module.

12. A voltage drive type semiconductor device according to claim 11, which further comprises a temperature sensing terminal connected to said junction point.

13. A temperature sensing circuit according to claim 1, wherein said semiconductor element is an IGBT.

14. A temperature sensing circuit according to claim 7, wherein said semiconductor element is an IGBT.

15. A method according to claim 8, wherein said semiconductor element is an IGBT.

16. A drive device according to claim 9, wherein said semiconductor element is an IGBT.

17. A voltage drive type semiconductor device according to claim 11, wherein the first semiconductor element is an IGBT.

* * * * *